United States Patent [19]
Langer et al.

[11] Patent Number: 5,337,013
[45] Date of Patent: Aug. 9, 1994

[54] METHOD AND APPARATUS FOR MONITORING THE OPERATION OF ELECTRICAL LOADS IN AN AUTOMOTIVE VEHICLE

[75] Inventors: Peter Langer, Troy; Karl W. Wojcik, Sterling Heights; Todd A. Snover, Oak Park, all of Mich.

[73] Assignee: Ford Motor Company, Dearborn, Mich.

[21] Appl. No.: 896,779

[22] Filed: Jun. 10, 1992

[51] Int. Cl.$^5$ .............................................. G01R 31/02
[52] U.S. Cl. ...................................... 324/537; 324/503;
307/10.1; 307/34; 340/439; 364/424.03
[58] Field of Search ............... 324/503, 509, 510, 511,
324/537, 73.1; 307/9.1, 10.1, 10.7, 32, 33, 34,
39; 361/187; 340/664, 657, 439; 364/424.03,
424.04

[56] References Cited
U.S. PATENT DOCUMENTS

| | | | |
|---|---|---|---|
| 3,912,883 | 10/1975 | Goodyear | 179/175.3 |
| 4,310,770 | 1/1982 | Keener et al. | 307/39 X |
| 4,661,717 | 4/1987 | Nishioka | 307/10 |
| 4,774,510 | 9/1988 | Steinke | 340/825.17 |
| 4,894,648 | 1/1990 | Talbot | 340/825.06 |
| 4,931,778 | 6/1990 | Guajardo | 340/664 |
| 4,962,350 | 10/1990 | Fukuda | 323/283 |

FOREIGN PATENT DOCUMENTS

| | | |
|---|---|---|
| 0011359 | 5/1980 | European Pat. Off. . |
| 0408867 | 5/1990 | European Pat. Off. . |
| 4004413 | 8/1990 | Fed. Rep. of Germany . |
| 9116637 | 10/1991 | PCT Int'l Appl. . |

OTHER PUBLICATIONS

Patent Abstracts of Japan, vol. 12, No. 235 (P-725) (3082) Jul. 6, 1988 and JP, A, 63 27 769 (Jidosha Kiki) Feb. 5, 1988.

Primary Examiner—Kenneth A. Wieder
Assistant Examiner—Glenn W. Brown
Attorney, Agent, or Firm—Roger L. May; Paul K. Godwin, Jr.

[57] ABSTRACT

Method and apparatus for monitoring the operation of a plurality of electrical loads in an automotive vehicle with a single current sensor. The current sensor detects the change in the total output current associated with the electrical loads and generates an output signal based on the current change. The apparatus also includes a controller which activates each electrical load at a given time to obtain a like plurality of timing signals so that each electrical load receives a portion of the output current. The controller processes the output signal and the timing signals to obtain a diagnostic signal related to an operating condition of at least one of the electrical loads. Finally, the controller controls an operating state of the at least one of the electrical loads based on the diagnostic signal.

14 Claims, 8 Drawing Sheets

METHOD AND APPARATUS FOR MONITORING THE OPERATION OF ELECTRICAL LOADS IN AN AUTOMOTIVE VEHICLE

TECHNICAL FIELD

The present invention is related to current sensing, and more particularly, to centralized current sensing of multiple loads in an automotive vehicle.

BACKGROUND ART

Circuitry designed to sense the current associated with one or more electrical loads are known in the art. As is known, current sensing circuitry can provide for increased control as well as fault diagnosis. For example, U.S. Pat. No. 4,661,717, issued to Nishioka, discloses a load condition determining apparatus capable of detecting normal and abnormal conditions of a load. The apparatus includes a power supply, a drive circuit connected to the power supply and a load circuit, one end of which is connected to the drive circuit. The apparatus also includes a load equivalent circuit connected to the drive circuit, the electrical characteristics of the load equivalent circuit being substantially equal to that of the load circuit. The apparatus further includes a differential amplifier circuit to detect the difference between the input voltages to the differential amplifier circuit in accordance with the conditions of the load circuit and comparing means having first and second comparators connected to the output of the differential amplifier circuit, to determine the normal and abnormal conditions of the load circuit in accordance with the balance and unbalance between the input voltages to the differential amplifier circuit.

U.S. Pat. No. 4,962,350, issued to Fukuda, discloses a load condition detecting and driving system capable of detecting an abnormal condition of the load without being affected by any acceptable variation of the load or change in the voltage supplied by a power source. The system includes switching means having a control terminal, a second terminal of the switching means being coupled to an input terminal of a load, the control terminal being coupled to receive a driving signal for controlling the switching means to apply driving current to the load. The system further includes coupling means coupled between the input terminal and the control terminal for rendering the switching means non-conductive when the load exhibits a short-circuit condition due to a voltage at the output terminal of the load becoming low because of the short-circuit condition.

Other United States patents of lesser relevance include U.S. Pat. No. 3,912,883, issued to Goodyear, U.S. Pat. No. 4,774,510, issued to Steinke, U.S. Pat. No. 4,894,648, issued to Talbot and U.S. Pat. No. 4,931,778, issued to Guajardo.

It is desirable, however, to utilize centralized current sensing of multiple loads wherein single point current sensing identifies normal and abnormal current magnitudes of multiple loads. Such current sensing would have a lower cost than prior art current sensing systems, provide for control, prognostic and diagnostic capabilities while accommodating different numbers and types of loads with appropriate software changes.

SUMMARY OF THE INVENTION

It is an object of the present invention to provide an apparatus for low cost, centralized current sensing of multiple loads in an automotive vehicle.

It is a further object of the present invention to provide a method and apparatus for single point current sensing to identify normal and abnormal operating conditions of multiple loads in an automotive vehicle and to provide for control, diagnostic and prognostic capabilities.

In carrying out the above objects and other objects and features of the present invention, an apparatus is provided for monitoring the operation of a plurality of electrical loads in an automotive vehicle, the loads collectively requiring an output current. The apparatus comprises single detecting means for detecting a change in the output current and generating an output signal based on the change. The apparatus also comprises control means for activating each electrical load at a given time to obtain a like plurality of timing signals so that each activated electrical load receives a portion of the output current. Preferably, the control means processes the output signal and the timing signals to obtain a diagnostic signal related to an operating condition of each activated electrical load.

In further carrying out the above objects and other objects and features of the present invention, a method is provided of monitoring the operation of a plurality of electrical loads in an automotive vehicle, the loads collectively requiring an output current. The method is for use with a single current sensing means and a controller having a memory and comprises the steps of activating at least one of the electrical loads to obtain to at least one timing signal and detecting a change in the output current to determine an actual current differential. The method also comprises the steps of correlating the actual current differential with acceptable current differentials stored in the memory, to obtain a diagnostic signal related to an operating condition of the at least one of the electrical loads. The method may also comprise the step of controlling the operating state of the at least one of the electrical loads based on the diagnostic signal.

The method may also include the steps of comparing the actual current differential to a plurality of prior actual current differentials to detect a trend, and predicting a future operating condition of the electrical loads based on the comparison.

The above objects and other objects, features, and advantages of the present invention will be readily appreciated by one of ordinary skill in the art from the following detailed description of the best mode for carrying out the invention when taken in connection with the accompanying drawings.

BEST MODE FOR CARRYING OUT THE INVENTION

Figure 1:
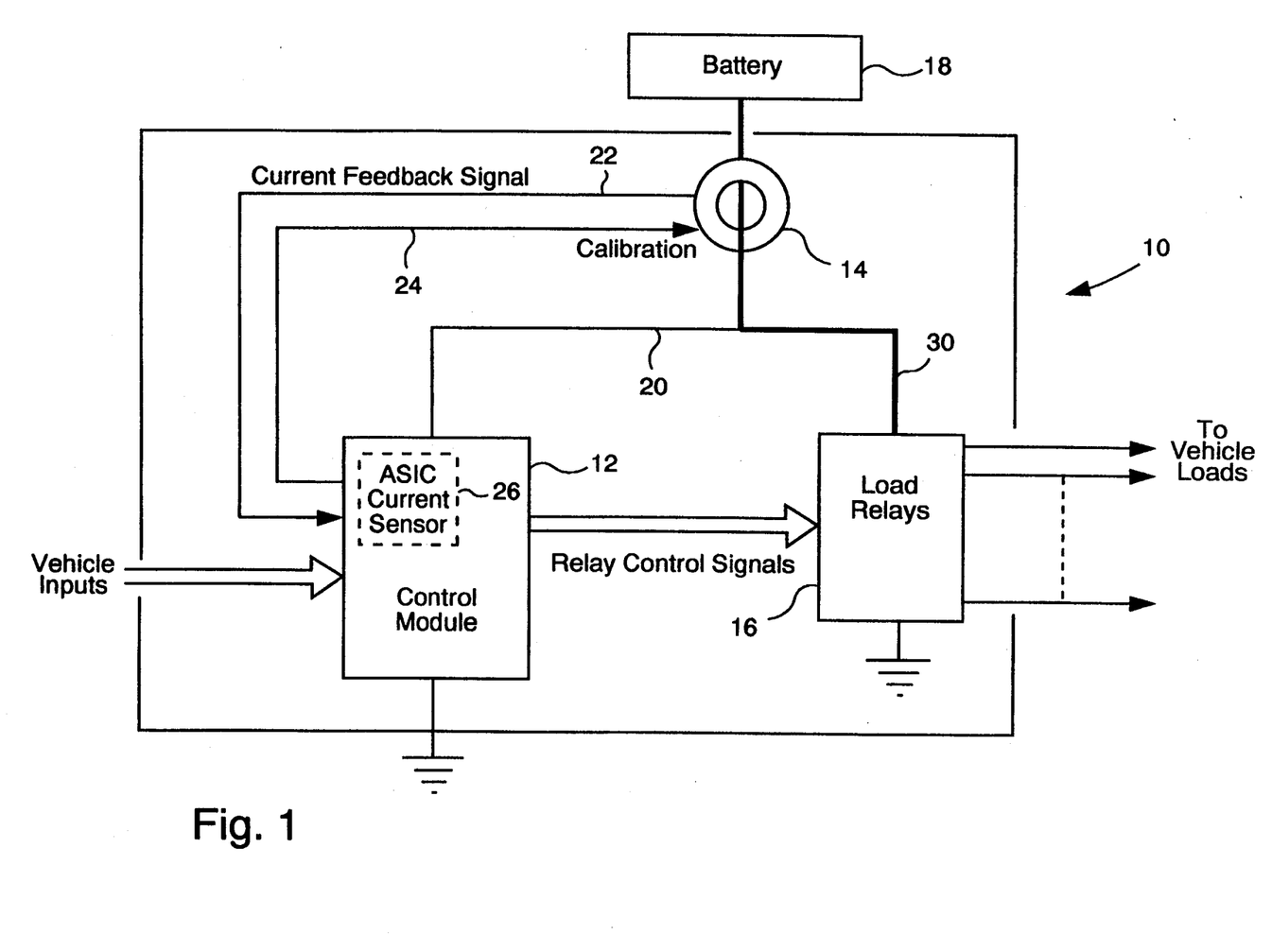
FIG. 1 is a block diagram of a first embodiment of the current sensing apparatus of the present invention.

Referring now to FIG. 1, there is illustrated a current sensing apparatus shown generally by reference numeral 10. In this preferred embodiment, the current sensing apparatus 10 is for use as an on-vehicle application to provide continuous monitoring of the vehicle's electrical loads. As illustrated, the current sensing apparatus 10 includes a microcontroller-based control module 12 and a current sensor 14, which senses the current associated with the activation of a plurality of electrical loads (not specifically illustrated). The control module 12 initiates control signals to the plurality of relays shown generally by reference numeral 16 to activate associated electrical loads. The battery 18 provides power to the various system components.

As best shown in FIG. 1, the control module 12 receives DC power from the battery 18 via line 20 and is in electrical communication with the current sensor 14 via lines 22 and 24. The control module 12 preferably includes an application specific integrated circuit (ASIC) 26 which includes current sensing circuitry shown in FIG. 2 and described in greater detail below. The control module 12 also a microprocessor, RAM and ROM memories, an analog-to-digital (A/D) converter and a digital-to-analog (D/A) converter not specifically illustrated. The line 22 is utilized for current feedback and the line 24 is utilized for calibrating the current sensor offset correction, as explained in greater detail below.

With continuing reference to FIG. 1, the current sensor 14 is preferably a toroid. The toroid output voltage has both a negative and positive range (e.g. about $-5V$ to about $+5V$). A DC offset is utilized to shift the toroid output voltage to a range of about $0V$ to about $+10V$, such that the toroid output is essentially at ground potential (i.e. about 100 mV) at very low sensed currents. Of course, toroids having entirely positive or entirely negative output voltage ranges could also be utilized. Although the current sensor 14 is shown to be a toroid, which provides the advantage of permitting the monitoring of multiple conductors, a simple resistor 14' or the like could be employed as a current sensor where a single conductor functions as a current feed to a plurality of circuits.

In the preferred embodiment, the toroid 14 encircles or surrounds either a single bus or a plurality of electrical conductors shown generally by reference numeral 30. Each of the conductors 30 surrounded by the toroid 14 is associated with a particular electrical load, such as an incandescent lamp, a motor, a solenoid and the like. As shown, the conductors 30 extend from the battery 18 through the toroid 14 to their associated relays shown generally by reference numeral 16. Thus, upon actuation of the relays 16 by the control module 12, the electrical conductors 30 carry current from the battery 18 through the toroid 14 to the electrical loads.

Figure 2:
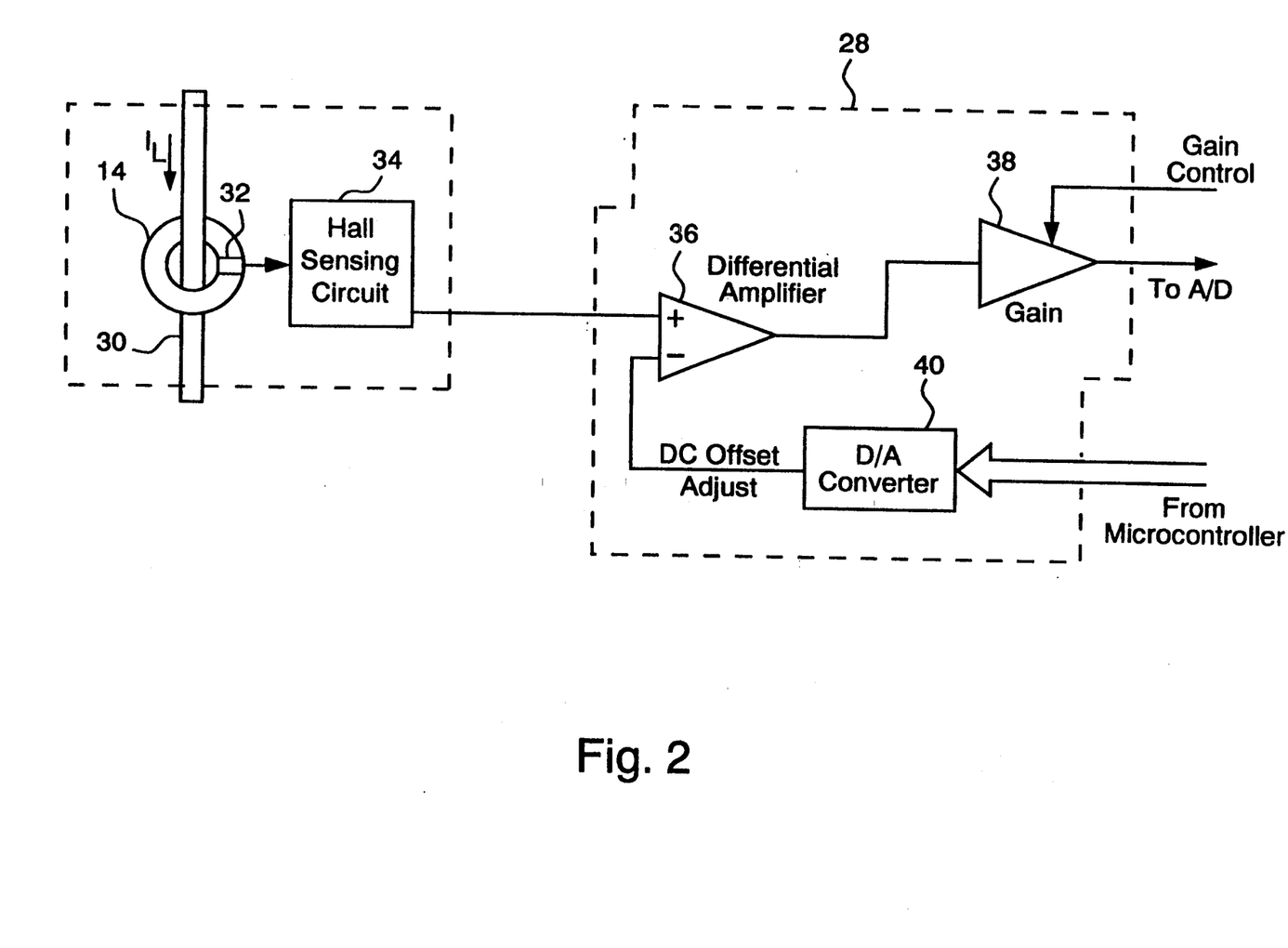
FIG. 2 is a block diagram of a current sensing circuit for use with the current sensing apparatus shown in FIG. 1.

Referring now to FIG. 2, there is illustrated a block diagram of a current sensing circuit shown generally by reference numeral 28 for use with the current sensing apparatus 10 shown in FIG. 1. In the preferred embodiment, the current sensing circuitry 28 is implemented on the ASIC 26. The toroid 14 includes a Hall effect element 32 for sensing the magnetic field associated with the current ($I_L$) flowing through the electrical conductors 30. The Hall element 32 generates a voltage signal based on the magnitude of the $I_L$, which is then processed by standard Hall sensor signal conditioning circuitry 34. Generally, the signal conditioning circuitry receives a low voltage signal (e.g. 10 mV) from the Hall element 32 and amplifies the signal to a value of about 5V maximum. The amplified signal from the Hall sensing circuitry 34 is then provided to the non-inverting terminal of a differential amplifier 36. The output of the amplifier 36 is a function of the difference between the signal from the Hall sensing circuitry 34 and a voltage (i.e. adc offset adjust) applied to the inverting terminal of the differential amplifier 36. The dc offset adjust is provided to the differential amplifier 36 from a digital-to-analog (D/A) converter 40. The D/A receives digital data from the microcontroller of the control module 12 and converts it into an associated analog voltage, i.e., the dc offset adjust. An amplifier 38 having a gain control adjusted by the control module 12 receives the output from the differential amplifier 36 and generates an analog output. The gain control signal reduces the gain of amplifier 38 when the signal into amplifier 38 is large and increases the gain when the signal into amplifier 38 is small. The analog output of the amplifier 38 is then converted to a corresponding digital representation by the analog-to-digital (A/D) converter (not specifically illustrated) of the control module 12. Gain control maximizes the span or range of the A/D, increasing the overall sensitivity of the current sensing apparatus 10 of the present invention. Therefore, based on the current feedback signal from the toroid 14, the control module 12 is capable of determining the amount of current associated with operation of an electrical load. From this information, the control module can determine the actual operating condition, such as an "open" or a "short", of the electrical load. Depending on the operating condition, the control module controls the operating state of the electrical loads as described in greater detail below.

Figure 3:
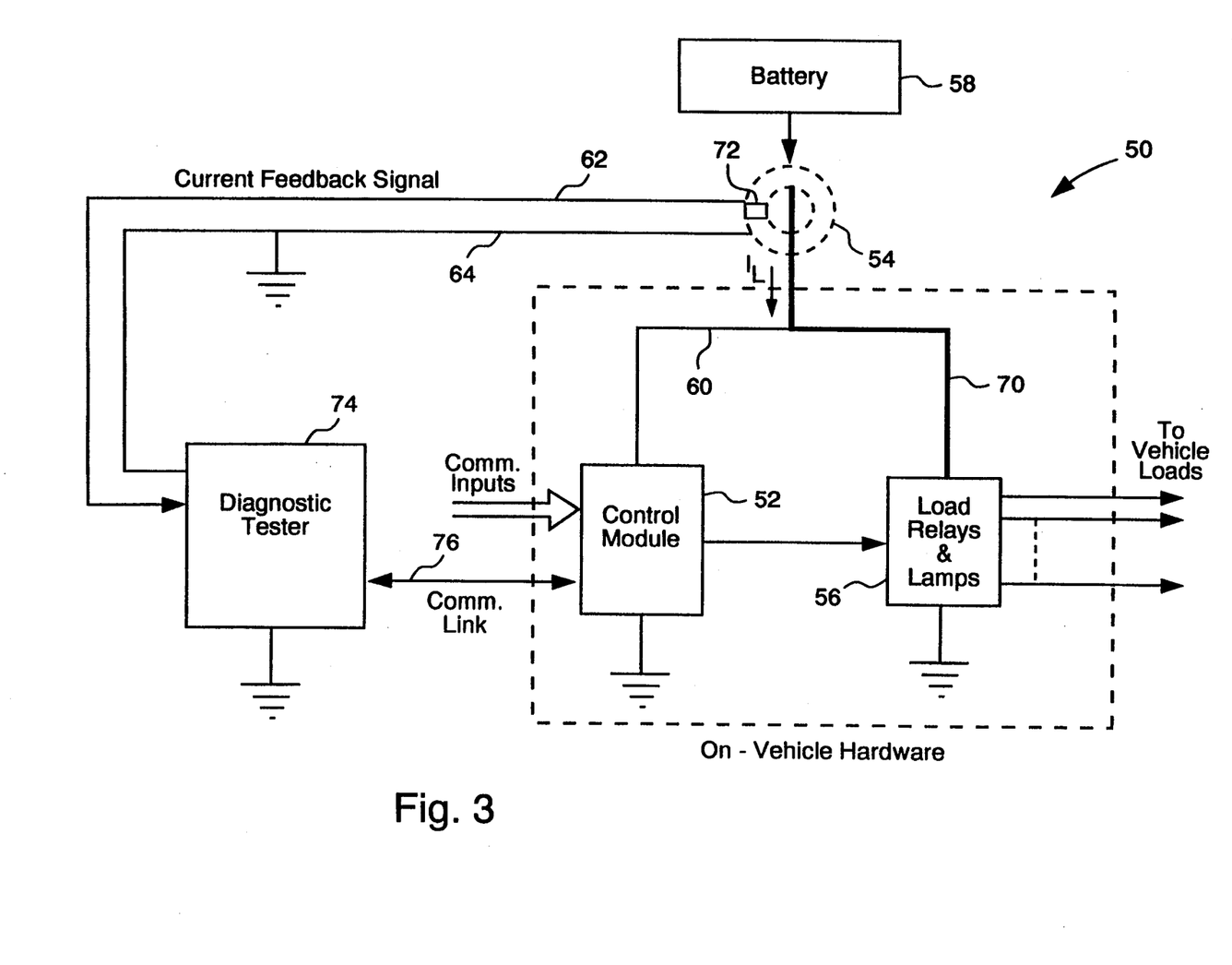
FIG. 3 is a block diagram of a second embodiment of the current sensing apparatus of the present invention.

Referring now to FIG. 3, there is illustrated a second embodiment of a current sensing apparatus shown generally by reference numeral 50. In this preferred embodiment, the current sensing apparatus 50 is for use as an off-vehicle application, wherein diagnostic test module 74 and the current sensor 54 are attached to a vehicle when testing is required. Preferably, the current sensing apparatus 50 includes a microcontroller-based control module 52 and a current sensor 54, which senses the current associated with the activation of a plurality of electrical loads (not specifically illustrated). The control module 52 initiates control signals to the plurality of relays shown generally by reference numeral 56 to activate associated loads. The battery 58 provides power to the various system components.

As best shown in FIG. 3, the control module 52 receives power from the battery 58 via line 60 and is in electrical communication with the current sensor 54 via lines 62 and 64. The control module 52 includes a microprocessor, RAM and ROM memories, and an analog-to-digital (A/D) converter not specifically illustrated. Preferably, the line 62 is utilized for current feedback and the line 64 is utilized for grounding the current sensor 14.

With continuing reference to FIG. 3, the current sensor 54 is preferably a toroid-shaped current clamp having an output voltage range of about 0V to about +10V. The current sensor 54 is removably affixed to a wire harness or the like in a known manner, preferably encircling a plurality of electrical conductors shown generally by reference numeral 70. Each conductor may be associated with a particular electrical load or a number of loads, such as an incandescent lamp, a motor, a solenoid and the like. As shown, the conductors 70 extend from the battery 58 through the toroid current sensor 54 to their associated relays shown generally by reference numeral 56. Thus, upon actuation of the relays by the control module 52, the electrical conductors 70 carry current from the battery 58 to the electrical loads, where the current is sensed by the current sensor 54.

As shown in FIG. 3, the current sensor 54 preferably includes a Hall element 72 for sensing the magnetic field associated with the current ($I_L$) flowing through the plurality of electrical conductors 70. The Hall element 72 generates a voltage signal based on the magnitude of the current $I_L$ which is then processed by an off-board diagnostic tester 74. It should be appreciated that the current sensor 54 could have a number of output voltage ranges, such as both negative and positive (i.e. $-5V$ to $+5V$) and for use therewith the diagnostic tester 74 could include circuitry substantially similar to the Hall sensing circuitry 34 of the prior embodiment described above with respect to FIG. 2.

In this preferred embodiment, the diagnostic tester 74 can be incorporated in a portable, hand-held unit that communicates with the control module 52 through a serial data link 76, such as an ISO 9141 data link. More particularly, the diagnostic tester 74 issues commands through the data link 76 to the control module 52 to activate a particular electrical load. The control module 52 responds and provides data to the diagnostic tester 74 indicative of the expected increase in current flow through the conductors 70 resulting from the activation of the load. Therefore, based on the current feedback signal from the current sensor 54, the diagnostic tester 74 is capable of determining the amount of current associated with operation of an electrical load. From this information, the diagnostic tester 74 can determine the actual operating condition, such as an "open" or a "short", of the electrical load Depending on the operating condition, the diagnostic tester 74 controls the operating state of the electrical loads as described in greater detail below. As one alternative, the current sensing apparatus 50 could be configured such that the diagnostic tester 74 includes data indicative of the expected increase in current flow through the conductors 70 resulting from the activation of the load.

Figure 4A:
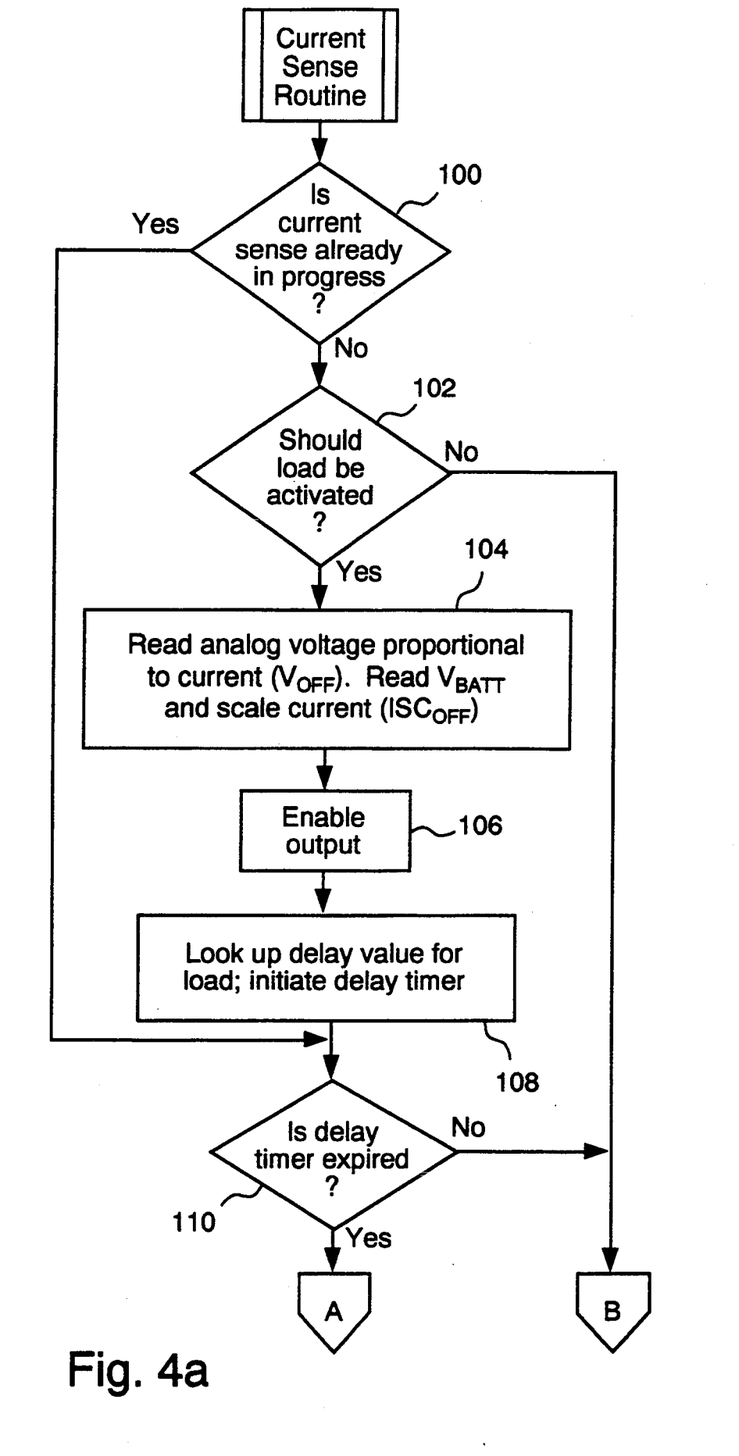
FIGS. 4a–4c comprise a flow chart illustrating the current sensing methodology for use with the current sensing apparatus shown in FIG. 1.
Figure 4B:
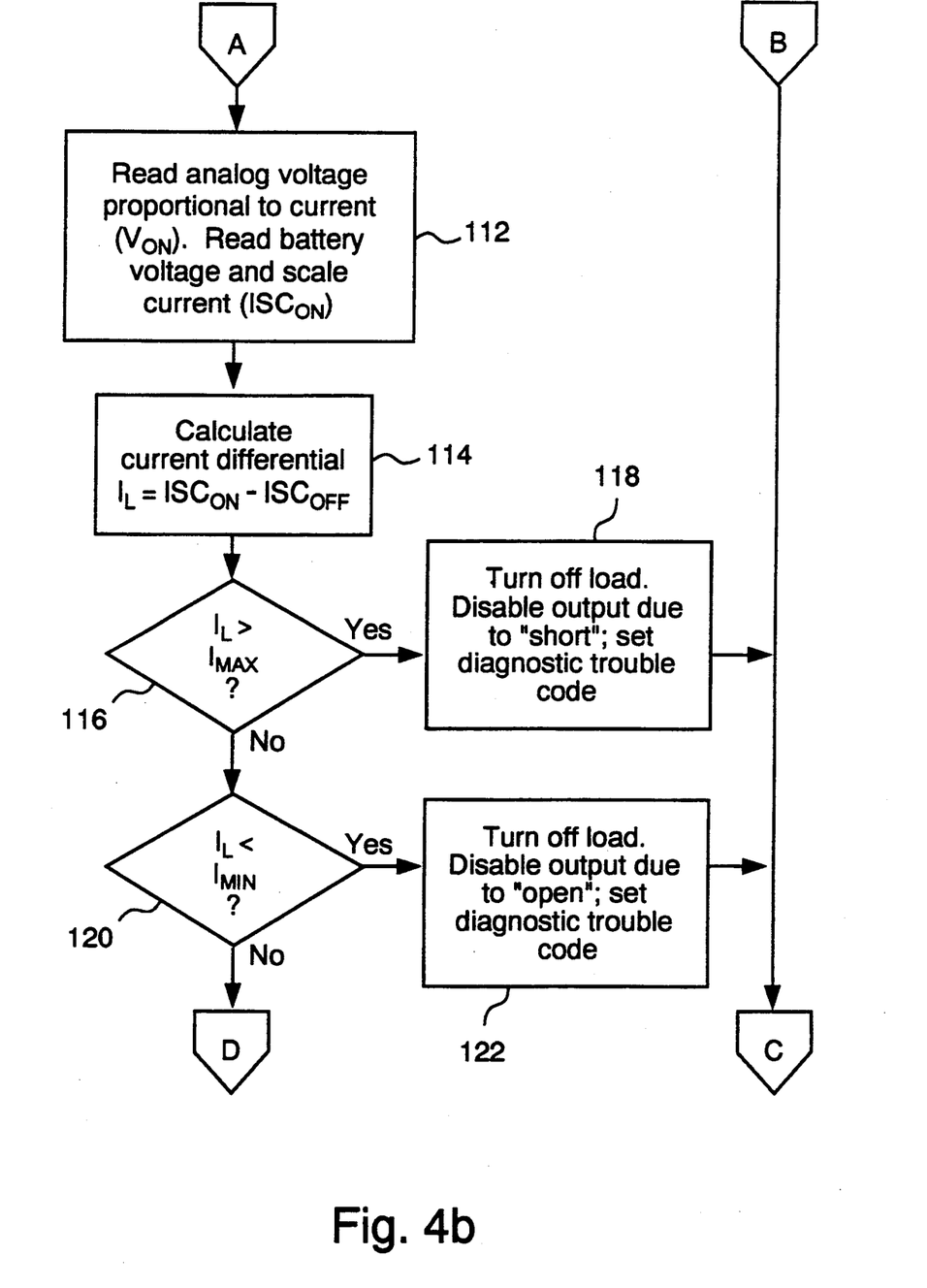
Figure 4C:
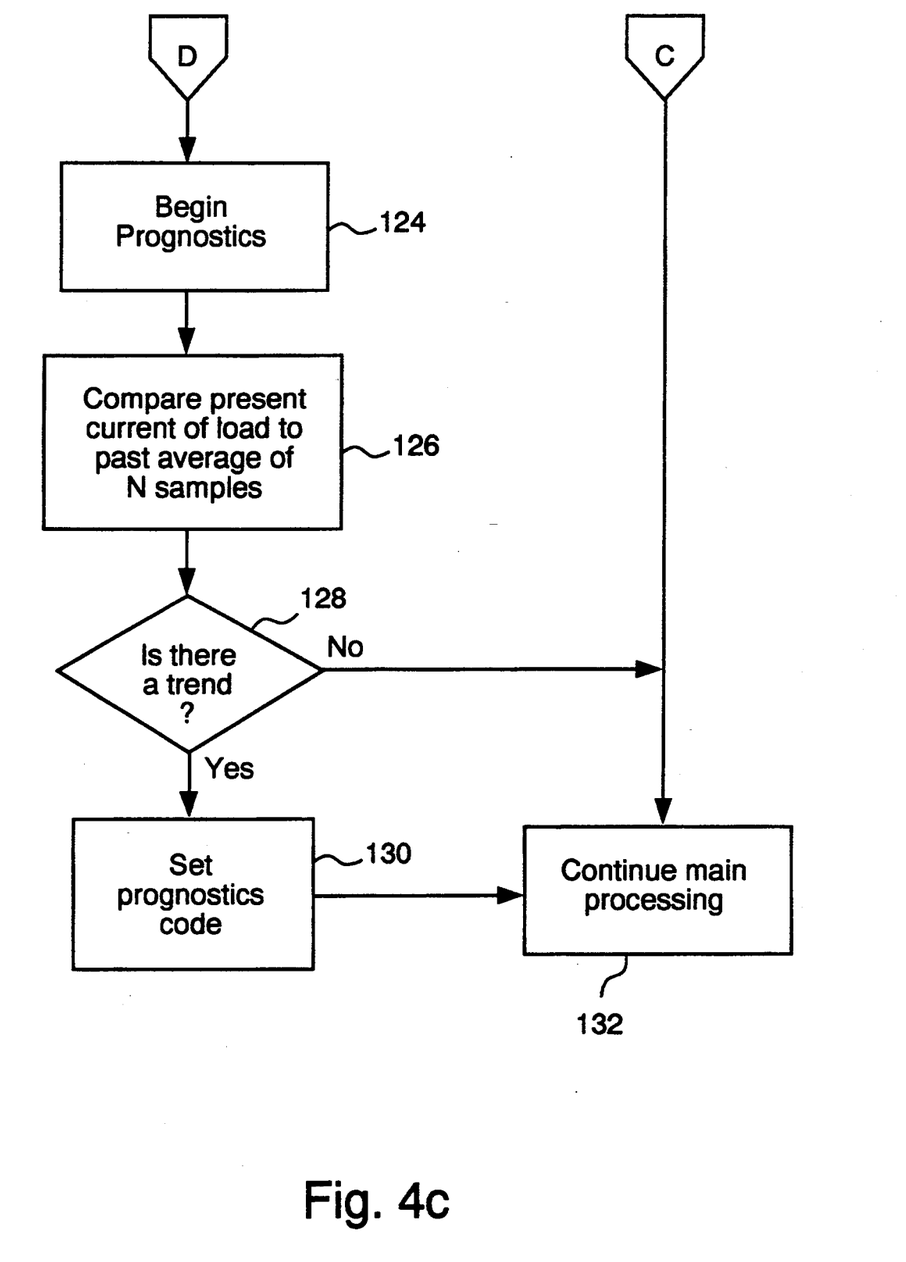

Referring now to FIGS. 4a–4c, a flow chart is shown detailing the general operation of the current sensing methodology for use with the current sensing apparatus 10 shown in FIG. 1. Since it is for use with an on-vehicle current sensing apparatus, this current sensing methodology is preferably performed routinely during normal vehicle operation. When a current sense operation is initiated, an internal "current sense in progress" flag is set. At step 100 in FIG. 4a, the control module 12 checks the status of the flag to determine whether or not a current sense operation is already in progress. If a current sense operation is already in progress, control flow "jumps" to step 110.

If no current sensing is being performed, at step 102 the control module determines if the particular electrical load should be activated. For example, the vehicle operator may have depressed a power window button, signalling the control module to activate the window motor, thereby raising or lowering the window. If the load should not be activated for some reason, control flow exits the current sense routine and control is returned to main processing at step 132.

If the electrical load should be activated, the control module 12 reads the analog voltage signal ($V_{OFF}$) from the toroid 14 at step 104, prior to activation of the load, to establish a reference current. Thus, the voltage signal corresponds to the current flow through the conductors 30 prior to activation of a particular electrical load. Also at step 104, the control module 12 senses the battery voltage, which is then utilized to scale, or normalize, the reference current reading ($ISC_{OFF}$).

At step 106, the control module enables the appropriate output, sending a control signal to the associated relay 16 to activate the particular load. A delay timer is started at step 108 with the delay value for the specific load obtained from a look-up table stored in the memory of the control module 12. The actual amount of delay is largely unnoticeable by the vehicle operator and varies from load to load, depending primarily on the electrical characteristics of the load. For example, if the load is an incandescent lamp, it is desirable to wait for the in-rush current to subside prior to sensing the load current. A typical delay time for an incandescent lamp load is 50 mS. If the load is capacitive in nature, the delay value is based on the RC time constant, since it is desirable to wait for the current to ramp up to a certain level. If the delay time has not expired, control flow exits from the current sense routine, freeing the control module to perform "housekeeping" functions and the like. In this manner, this strategy provides a real-time aspect to the current sensing methodology.

The next time the current sense routine is cycled, control flow would immediately jump from step 100 to step 110 to determine if the delay timer had since expired. This control flow jump prevents the delay timer from being reinitiated.

If the delay timer has elapsed at step 110, the magnitude of the load current can be measured. At step 112 in FIG. 4b, the control module 12 senses an analog voltage signal ($V_{ON}$) from the toroid 14. This analog voltage signal is proportional to the current flowing through the electrical conductors 30 which includes the current associated with the activated load. The control module 12 again senses the battery voltage which is utilized to obtain a scaled current ($ISC_{ON}$).

At step 114, the control module 12 calculates the difference between the scaled off current and the scaled on current, which represents the current associated with the activated load ($I_L$). At step 116, the control module 12 determines whether or not the scaled differential current ($I_L$) exceeds the maximum allowable current ($I_{MAX}$) for that load. The control module 12 thus performs a comparison between the value of load current and a plurality of values stored in a look-up table. Preferably, these maximum table values are established for each type of electrical load based on certain considerations, such as the worst case upper and lower temperatures associated with the location of the load in the vehicle.

In the preferred embodiment, if the differential load current exceeds the maximum allowable current, at step 118 the control module 12 sends an appropriate control signal to the relay 16 and the load is turned off. Additionally, the control module disables the output associated with that electrical load and sets an internal diagnostic trouble code indicative of an electrical "short." The control module thus implements a "software fuse", disabling the output very quickly to avoid blowing a hardware fuse or circuit breaker or allowing any components to be damaged.

If the load current does not exceed the maximum allowable current at step 116, the control module 12 compares the differential load current to a minimum allowable current for that load at step 120. This comparison is also made utilizing a look-up table of values established for each type of load based on certain considerations, such as the worst case upper and lower temperature of the location of the load in the vehicle.

If the load current is less than the minimum allowed current, at step 122 the control module 12 sends a control signal to the appropriate relay 16 and the load is turned off. Additionally, the control module 12 quickly disables the output associated for that electrical load and sets a diagnostic trouble code in memory indicative of an electrical "open."

If, however, the load current is within the maximum and minimum allowed currents, the control module 12 begins a prognostic test at step 124 in FIG. 4c to predict load failures. As an electric motor ages, internal mechanisms can become rusty and corroded, developing increases in its friction components. As this aging process occurs, the motor draws larger amounts of current during operation. Thus, as load current increases over time, failure of the motor can be predicted.

At step 126, the control module 12 compares the scaled differential load current to an average of the previous N samples. At step 128, the control module 12 determines whether the sampled load currents indicate whether such a trend is occurring. If the sensed load currents indicate a trend, at step 130 the control module 12 sets an appropriate prognostics code in the memory. At step 132, main code processing continues. The temperature of the location of the motor or other load could also be sensed and utilized in the determination of trends, since temperature can affect the amount of current drawn by a load.

Figure 5:
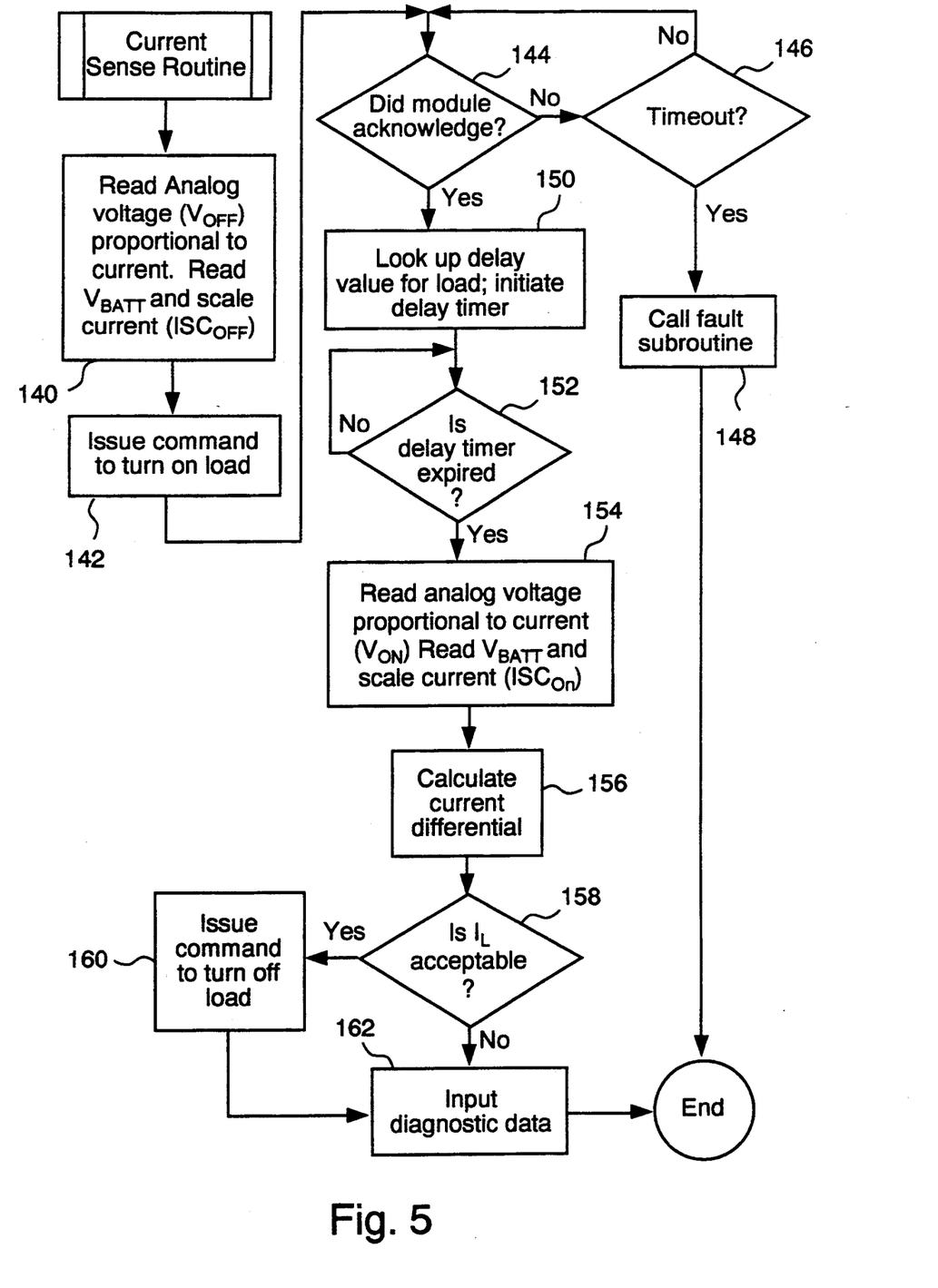
FIG. 5 is a flow chart illustrating the current sensing methodology for use with the current sensing apparatus shown in FIG. 3.

Referring now to FIG. 5, a flow chart detailing the general operation of the current sensing methodology is shown for use with the current sensing apparatus shown in FIG. 3. Since this is embodiment is for use with an off-vehicle current sensing apparatus, the current sensing methodology is performed while the vehicle control module is connected to the diagnostic tester 74.

At step 140, the test module reads the analog voltage signal ($V_{OFF}$) from the current sensor 54, prior to activation of the electrical load, to establish a reference current. Also at step 140, the test module senses the battery voltage ($V_{BATT}$), which is then utilized to scale, or normalize, the reference current reading ($ISC_{OFF}$).

At step 142, the test module 74 issues a command to the control module 52 to turn on the particular electrical load. Prior to proceeding with the current sensing operation, at step 144 the test module 74 waits for the control module 52 to acknowledge the command.

Preferably, the diagnostic tester waits for a "time out" to expire at step 146. If the "time out" period expires before the control module responds to the test module, control flow jumps to step 148 where an appropriate fault sub-routine is executed.

At step 150, a delay timer is started with the delay value for the specific load obtained from a look-up table stored in the memory of the control module 52. Of course, the delay value could be stored in the diagnostic tester 74. As in the prior embodiment, the actual amount of delay is largely unnoticeable by the vehicle operator and varies from load to load, depending primarily on the electrical characteristics of the load (e.g. resistive, capacitive, etc.). For example, a typical delay time for an incandescent lamp load is 50 mS. Since it is undesirable to sense the current before the delay timer has expired, step 152 is performed continuously until the condition is satisfied.

At step 154, the test module senses an analog voltage signal ($V_{ON}$) from the current sensor 54. This analog voltage signal is proportional to the current flowing through the electrical conductors 70 which includes the current associated with the load. The control module senses the battery voltage ($V_{BATT}$) which is then utilized to scale the current ($ISC_{ON}$). Utilizing $ISC_{OFF}$ and $ISC_{ON}$, at step 156 the test module computes the scaled differential load current, which represents the current associated with the activated load.

At step 158, the diagnostic tester 74 determines whether or not the scaled differential load current is acceptable. In making this determination, the diagnostic tester 74 utilizes data received from the control module indicative of the expected load current for that particular electrical load. If the load current is within the acceptable range, the operating condition of the load is acceptable and at step 160 the test module issues a command to the control module to turn off the electrical load.

At step 162, the diagnostic tester 74 provides appropriate diagnostic data to the control module regarding the operating condition (acceptable or unacceptable) of the load. Preferably, the control module then utilizes this diagnostic data to control the operating state of the electrical load. For example, if the load current was unacceptable, the diagnostic would consist of an appropriate fault code. In response to receipt of the fault code, the control module would disable the appropriate output to ensure no further attempts are made to activate the load. If no further current sensing operations are required to be performed, the diagnostic tester 74 can then be disconnected from the control module.

As an alternative, it should be appreciated that the diagnostic tester 74 could determine the operating condition of an electrical load utilizing load impedances. For example, the load impedance could be determined utilizing the $V_{ON/OFF}$ and $ISC_{ON/OFF}$ and then compared to predefined load impedances stored in a look-up table.

Figure 6:
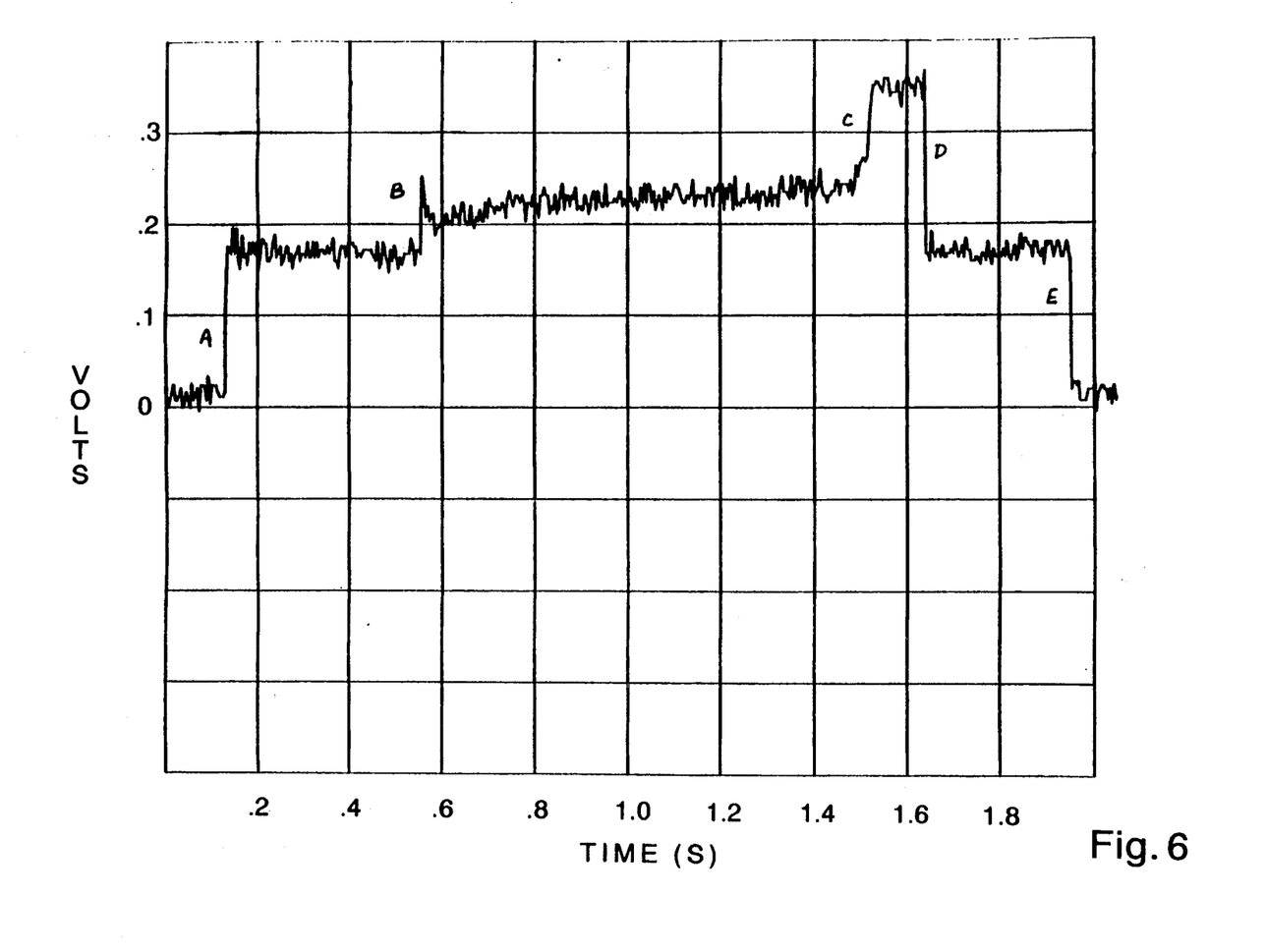
FIG. 6 is a graph illustrating a current plot obtained utilizing the method and apparatus of the present invention.

Referring now to FIG. 6, a graphical illustration is shown of a current plot obtained using the method and apparatus of the present invention. Specifically, the graph illustrates the voltage output from the current sensor as various electrical loads are activated and deactivated. Initially, the voltage output is approximately zero volts, which is representative of little or no current flowing through the conductors. As the rear window defogger load is activated by the vehicle operator, current is drawn from the battery through an associated electrical conductor. This increased current is sensed by the current sensing apparatus, resulting in the sharp increase in output voltage indicated by reference letter "A".

As the defogger is functioning, the current flow through the conductor and, therefore, the voltage output from the current sensor, remains essentially constant. The voltage output increases, however, with the activation of an additional electrical load, indicated generally by reference letter "B". This increase could correspond to the activation of a window motor in response to the vehicle operator depressing a power window button.

Operation of the window motor results in an increase in the current sensed by the toroid and a corresponding increase in the voltage signal. As the window is moving, the voltage level remains generally steady until the window motor "stalls" resulting in the sharp increase in the voltage generally indicated by reference letter "C". At the conclusion of the window motor stall condition (i.e. the power window button is released), current flow through the electrical motor ceases, resulting in the sharp decrease in the voltage output indicated generally by reference letter "D". As expected, the voltage output returns to a level associated with the continued operation of the rear window defogger. When the defogger is eventually deactivated, the voltage output level drops to approximately zero volts, as indicated generally by reference letter "E".

It is to be understood, of course, that while the forms of the invention described above constitute the preferred embodiments of the invention, the preceding description is not intended to illustrate all possible forms thereof. It is also to be understood that the words used are words of description, rather than limitation, and that various changes may be made without departing from the spirit and scope of the invention, which should be construed according to the following claims.

We claim:

1. An apparatus for monitoring the operation of a plurality of electrical loads in an automotive vehicle, the loads collectively requiring an output current from a power supply, the apparatus comprising:
    single detecting means for detecting the output current and generating an output signal based on the output current, the single detecting means being serially connected to the power supply and the loads;
    a plurality of devices, each of the devices selectively completing or breaking a current path from the power supply to its respective load in response to a control signal; and
    control means coupled to the single detecting means and the plurality of devices, the control means including a memory for storing a plurality of delay values corresponding to electrical characteristics of the loads, the control means:
    (1) receiving the output signal and an input signal corresponding to a first load;
    (2) generating a first control signal in response to the input signal, a first one of the devices completing its corresponding current path at a given time in response to the first control signal, so that a change in the output current occurs;
    (3) retrieving a first delay value corresponding to the first load from the memory in response to the input signal;
    (4) detecting a change in the output signal corresponding to the change in the output current after a first time delay from the given time based on the first delay value; and
    (5) generating a diagnostic signal in response to the change in the output signal, the diagnostic signal being related to an operating condition of the first load.

2. The apparatus of claim 1 wherein the control means controls an operating state of the first load based on the diagnostic signal.

3. The apparatus of claim 1 further comprising means for deactivating the first load and generating an associated fault code if a certain operating condition exists.

4. The apparatus of claim 1 further comprising means for predicting a future operating condition of the first load based on the output signal.

5. The apparatus of claim 1 further comprising means for scaling the output signal based on battery voltage to obtain an adjusted output signal.

6. The apparatus of claim 1 further comprising means for predicting a future operating condition of the first load based on the adjusted output signal.

7. The apparatus of claim 1 wherein the single detecting means is a toroid which encircles a plurality of electrical conductors associated with the electrical loads.

8. The apparatus of claim 1 wherein the current sensing means is a resistive element electrically connected in series with at least one electrical conductor associated with the electrical loads.

9. An apparatus for monitoring the operation of a plurality of electrical loads in an automotive vehicle including a control module having memory which stores plurality of delay values corresponding to electrical characteristics of the loads, the loads collectively requiring an output current from a power supply, the method comprising the steps of:
    detecting the output current and generating an output signal based on the output current;
    receiving the output signal and an input signal corresponding to a first load;
    generating a first control signal in response to the input signal;
    completing a circuit path from the power supply to the first load at a given time in response to the first control signal, so that a change in the output current occurs;
    retrieving a first delay value corresponding to the first load from the memory in response to the input signal;
    detecting a change in the output signal corresponding to the change in the output current after a first time delay from the given time based on the first delay value; and
    generating a diagnostic signal in response to the change in the output signal, the diagnostic signal being related to an operating condition of the first load.

10. The method of claim 9 further comprising the step of controlling the operating state of the first electrical load based on the diagnostic signal.

11. The method of claim 9 further comprising the steps of deactivating the first electrical load and storing an associated fault code in the memory if a certain operating condition exists.

12. The method of claim 9 further comprising the steps of:
    comparing the change in the output signal to a plurality of prior changes in the output signal to detect a trend; and predicting a future operating condition of the first electrical load based on the comparison.

13. The method of claim 9 further comprising the step of:

scaling the change in the output signal based on vehicle battery voltage to obtain an adjusted change in the output signal.

14. The method of claim 13 further comprising the steps of:

comparing the adjusted change in the output signal to a plurality of prior adjusted changes in the output signal to detect a trend; and predicting a future operating condition of the first electrical load based on the comparison.

* * * * *